US005791942A

United States Patent [19]

Patel

[11] Patent Number: 5,791,942

[45] Date of Patent: Aug. 11, 1998

[54] HIGH FREQUENCY ELECTRICAL CONNECTOR

[75] Inventor: Anila Patel, New Freedom, Pa.

[73] Assignee: Stewart Connector Systems, Inc., Glen Rock, Pa.

[21] Appl. No.: 507,468

[22] PCT Filed: Jan. 6, 1995

[86] PCT No.: PCT/US95/00257

§ 371 Date: Aug. 23, 1995

§ 102(e) Date: Aug. 23, 1995

[87] PCT Pub. No.: WO95/19056

PCT Pub. Date: Jul. 13, 1995

Related U.S. Application Data

[63] Continuation of Ser. No. 179,983, Jan. 11, 1994, abandoned.

[51] Int. Cl.$^6$ .......... H05K 1/00

[52] U.S. Cl. .......... 439/637; 439/60

[58] Field of Search .......... 439/607, 630–637, 439/885, 676, 60

[56] References Cited

U.S. PATENT DOCUMENTS

| | | | |
|---|---|---|---|
| 4,934,961 | 6/1990 | Piorunnede et al. | 439/637 |
| 4,996,766 | 3/1991 | Piorunneck et al. | 439/637 |
| 5,040,991 | 8/1991 | Collier | 439/60 |
| 5,259,768 | 11/1993 | Bruncker et al. | 439/637 |
| 5,269,707 | 12/1993 | Reichardt et al. | 439/60 |
| 5,399,107 | 3/1995 | Gentry et al. | 439/676 |
| 5,599,209 | 2/1997 | Belopolsky | 439/676 |

*Primary Examiner*—J. J. Swann

*Attorney, Agent, or Firm*—Steinberg, Raskin & Davidson, P.C.

[57] ABSTRACT

A high frequency electrical connector including a plurality of parallel contacts, a plurality of terminals, and conductors interconnecting the contacts to the terminals in a manner such that signals flowing through proximate contacts are transmitted in opposite directions to reduce near-end crosstalk.

6 Claims, 4 Drawing Sheets

HIGH FREQUENCY ELECTRICAL CONNECTOR

BACKGROUND OF THE INVENTION

This application is a 371 of PCT/US95/00257 filed Jan. 6, 1995, which is a PCT of Ser. No. 08/327,425, filed Oct. 21, 1994, now U.S. Pat. No. 5,639,266, which is a continuation of Ser. No. 08/179,983, filed Jan. 11, 1994, now abandoned.

This invention relates generally to electrical connectors and, more particularly, to an electrical connector for use in the transmission of high frequency signals.

Data communication networks are being developed which enable the flow of information to ever greater numbers of users at ever higher transmission rates. A problem is created, however, when data is transmitted at high rates over a plurality of circuits of the type that comprise multi-pair data communication cable. In particular, at high transmission rates, each wiring circuit itself both transmits and receives electromagnetic radiation so that the signals flowing through one circuit or wire pair (the "source circuit") may couple with the signals flowing through another wire pair (the "victim circuit"). The unintended electromagnetic coupling of signals between different pairs of conductors of different electrical circuits is called crosstalk and is a source of interference that often adversely affects the processing of these signals. The problem of crosstalk in information networks increases as the frequency of the transmitted signals increases.

In the case of local area network (LAN) systems employing electrically distinct twisted wire pairs, crosstalk occurs when signal energy inadvertently "crosses" from one signal pair to another. The point at which the signal crosses or couples from one set of wires to another may be 1) within the connector or internal circuitry of the transmitting station, referred to as "near-end" crosstalk, 2) within the connector or internal circuitry of the receiving station, referred to as "far-end crosstalk", or 3) within the interconnecting cable.

Near-end crosstalk ("NEXT") is especially troublesome in the case of telecommunication connectors of the type specified in sub-part F of FCC part 68.500, commonly referred to as modular connectors. Such modular connectors include modular plugs and modular jacks. The EIA/TIA of ANSI has promulgated electrical specifications for near-end crosstalk isolation in network connectors to ensure that the connectors themselves do not compromise the overall performance of the unshielded twisted pair interconnect hardware typically used in LAN systems. The EIA/TIA Category electrical specifications specify the minimum near-end crosstalk isolation for connectors used in 100 ohm unshielded twisted pair Ethernet type interconnects at speeds of up to 100 MHz.

While it is desirable to use modular connectors for data transmission for reasons of economy, convenience and standardization, the standard construction of modular jacks inherently results in substantial rear-end crosstalk at high frequency operation. In particular, conventional modular jacks generally comprise a plurality of identically configured contact/terminal wires that extend parallel and closely spaced to each other thereby creating the possibility of excessive near-end crosstalk at high frequencies.

High speed data transmission cable typically comprise four circuits defined by eight wires arranged in four twisted pairs. The cable is typically terminated by modular plugs having eight contacts, and specified ones of the four pairs of the plug contacts are assigned to terminate respective specified ones of the four cable wire pairs according to ANSI/EIA/TIA standard 568. The four pairs of plug contacts in turn engage four corresponding pairs of jack contacts. In particular, the standard 568 contact assignment for the wire pair designated "1" is the pair of plug and jack contacts located at the 4–5 contact positions. The cable wires of the pair designated "3" are, according to standard 568, terminated by the plug and jack contacts located at the 3–6 positions which straddle the "4–5" plug and jack contacts that terminate wire pair "1". Near-end crosstalk between wire pairs "1" and "3" during high speed data transmission has been found to be particularly troublesome in connectors that terminate cable according to standard 568.

When crosstalk occurs between electrically distinct circuits that are separated by a distance of much less than one wavelength, signal energy is transferred from one circuit to another either through inductive coupling, capacitive coupling, or a combination of the two. For Category 5 interconnects, the shortest wavelength of interest is 3 meters, corresponding to the highest frequency of operation, 100 MHz. Since connector contact spacing in Category 5 connectors is much less than 3 meters, capacitive (electric field) and/or inductive (magnetic field) coupling will be responsible for measurable crosstalk within the connector.

Capacitive coupling will dominate when:

1) source circuits switch large voltages very quickly (large dv/dt) and/or operate at relatively high impedance levels (>>1 kΩ);
2) source and/or victim circuits have large surface areas (wide, long conductors); and
3) source and victim circuits are closely spaced and separated by dielectrics (non-conductors) that increase mutual capacitance between the source and victim circuits.

Inductive coupling will dominate when:

1) source circuits switch large currents very quickly (large di/dt) and/or operate at relatively high impedance levels (<<100Ω);
2) source and/or victim circuits enclose large loop areas; and
3) source and victim circuits are closely spaced and have their current loops oriented along parallel axes.

SUMMARY OF THE INVENTION

Accordingly, it is an object of the present invention to provide new and improved connectors for use in data transmission at high frequencies.

Another object of the present invention is to provide new and improved high frequency connectors which reduce near-end crosstalk.

Still another object of the present invention is to provide new and improved modular connectors which reduce near-end crosstalk.

A still further object of the present invention is to provide new and improved high frequency electrical connectors which reduce near-end crosstalk and which are simple and inexpensive in construction.

Yet another object of the present invention is to provide new and improved modular jacks which reduce near-end crosstalk when connected to modular plugs that terminate high speed data transmission cable according to ANSI/EIA/TIA standard 568.

Briefly, these and other objects are attained by modifying the standard construction of modular jacks, which generally comprise a plurality of identically configured contact/ terminal wires, by providing one of at least one of the pairs of the jack contact/terminal wires that terminate respective cable wire signal pairs with a geometrical configuration that differs from the configuration of the other contact/terminal wire terminating that cable wire signal pair. In this manner, capacitive coupling is reduced by reducing the total surface area that is capable of storing charge between contact pairs, and inductive coupling is reduced by reducing magnetic field coupling between signal pairs by using asymmetrical contact pairs to tilt the axis of the contact pair's loop current, i.e. by tilting or skewing the path in which the signal current flows through the contact pair.

In a preferred embodiment, the modular jack has a plurality of contact/terminal wires, each of which defines a contact, a pin-like terminal, and a conductor portion interconnecting the contact and terminal. The contact/terminal wires of a first set each have a "rearward facing" configuration, i.e., the free end of the jack contact faces toward the closed end of the jack with the respective jack terminal being interconnected to the contact at the region of the open end of the jack so that signals transmitted through the contact flow toward the open end of the jack. In accordance with the invention, the jack is provided with a second set of contact/terminal wires, each of which is configured to define a jack contact that "faces forwardly", i.e., the free end of the jack contact faces toward the open end of the jack with the respective jack terminal being interconnected to the contact at the region of the closed end of the jack. Signals transmitted through the contacts of the second set flow toward the closed end of the jack, i.e., in a direction substantially opposite to the direction in which the signals flow through the contacts of the first set.

In the case of an eight contact, eight position modular jack adapted for connection to a modular plug terminating an eight wire (four signal pairs) cable in accordance with the wire-contact assignments specified by ANSI/EIA/TIA standard 568, near-end crosstalk is reduced to a substantial extent by providing the pairs of contact/terminal wires assigned to terminate wire or signal pairs "1" and "3" with asymmetrical configurations. Specifically, the contact/terminal wires at positions 4 and 5 which terminate wire pair "1" have asymmetrical configurations, while the contact/terminal wires at positions 3 and 6 which terminate wire pair "3" have asymmetrical configurations.

DESCRIPTION OF THE DRAWINGS

A more complete appreciation of the present invention and many of the attendant advantages thereof will be readily understood by reference to the following detailed description when considered in connection with the accompanying drawings in which.

DETAILED DESCRIPTION OF THE PREFERRED EMBODIMENT

Figure 1A:
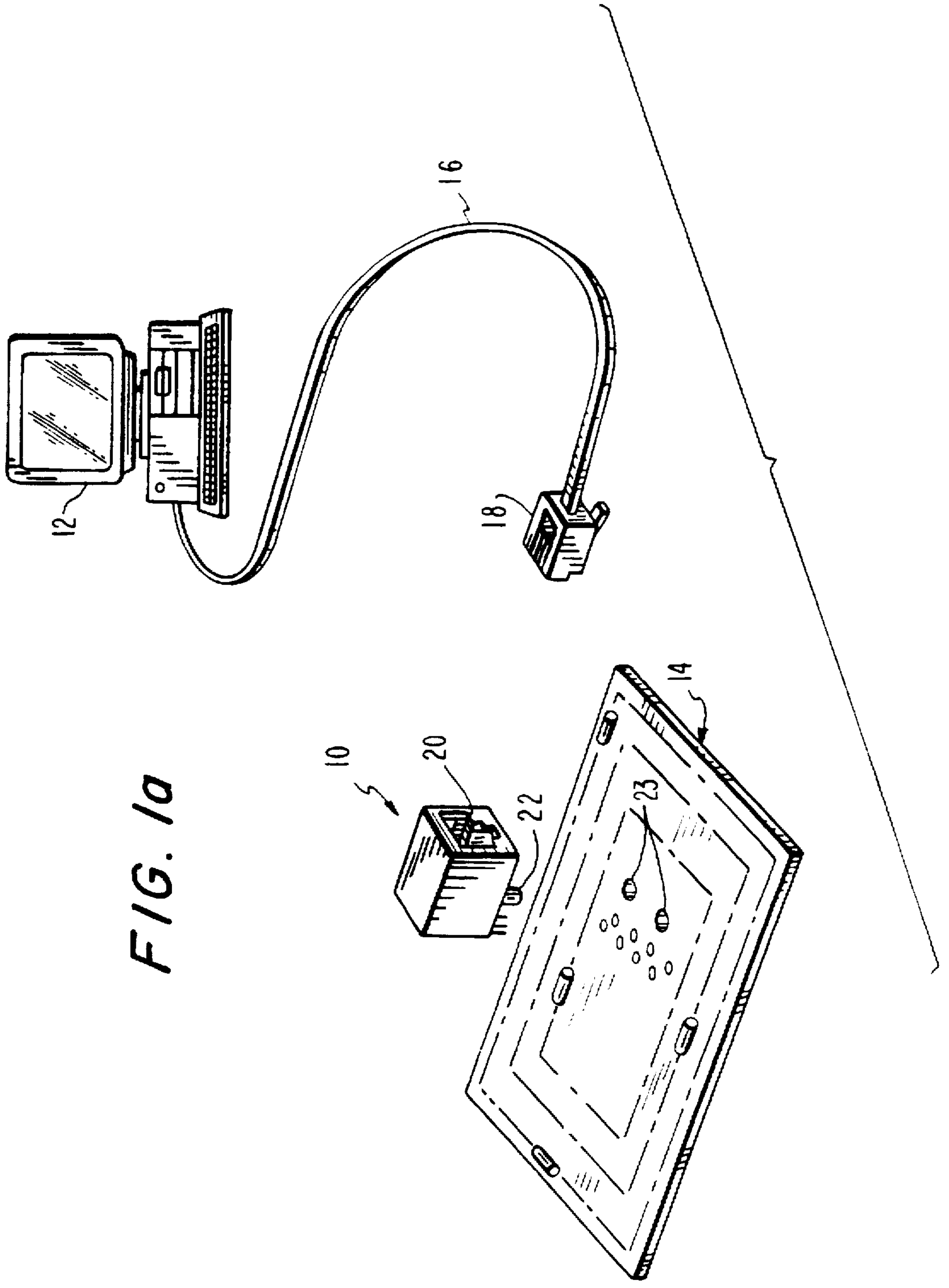
FIG. 1*a* shows in exploded schematic perspective a jack connector in accordance with the invention in use for coupling high speed communication equipment to a printed circuit board via a communication cable terminated by a modular plug.
Figure 1B:
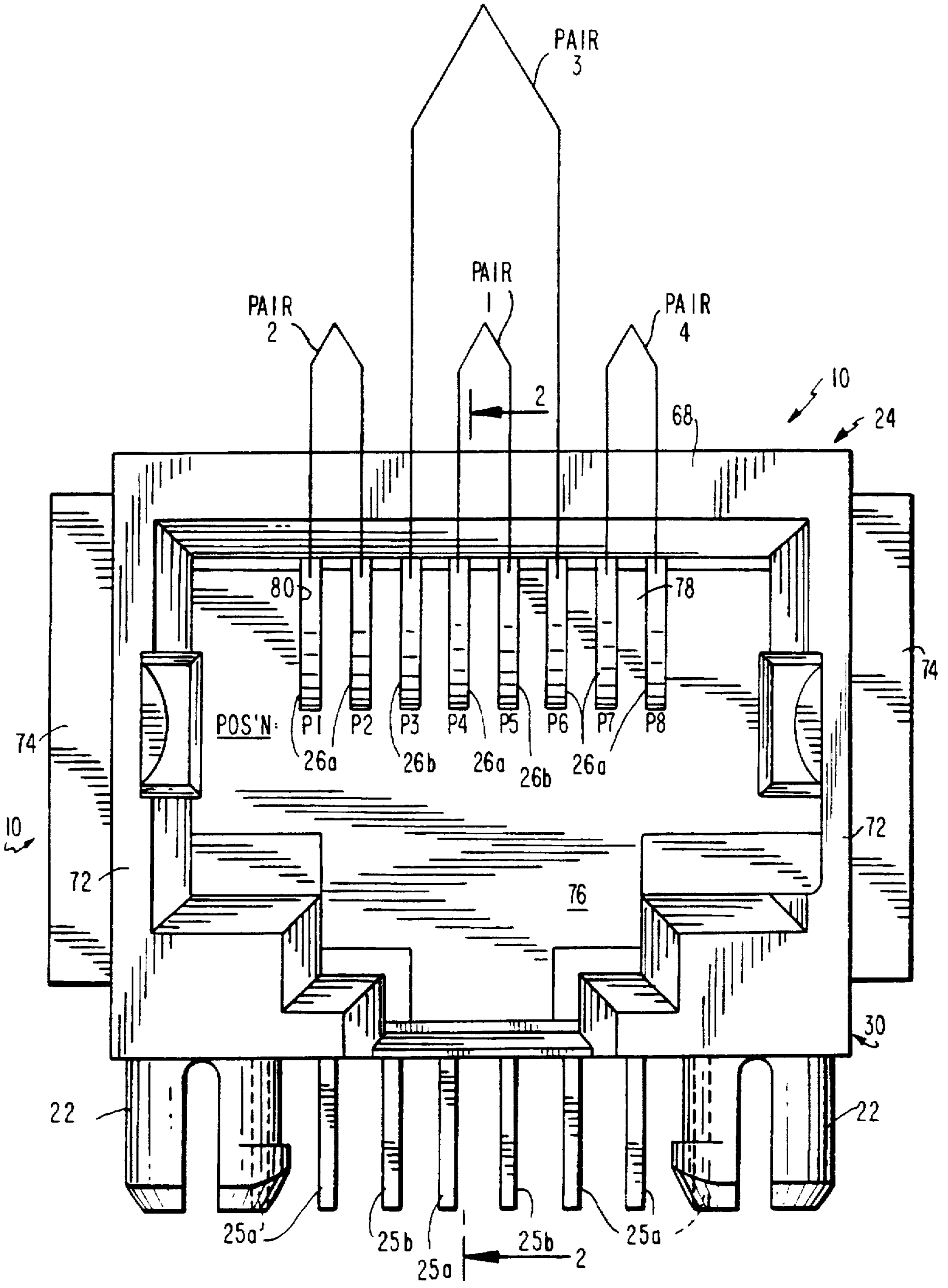
FIG. 1*b* is a front elevation view of a jack connector in accordance with an embodiment of the invention illustrating the wire-plug contact assignments specified for a mating plug by ANSI/EIA/TIA standard 568 by reference to the jack contacts to be engaged by those plug contacts.

Referring now to the drawings wherein like reference characters designate identical or corresponding parts throughout the several views, FIG. 1*a* illustrates a jack 10 in accordance with the invention for coupling high speed communication hardware 12 to a printed circuit board 14 via a high speed communication cable 16 terminated by a modular plug 18. The jack 10 has a receptacle 20 adapted to receive the modular plug 18. Coupling of the hardware 12 to the printed circuit board 14 is made more convenient by the use of connectors 10 and 18 having standard modular features of the type specified in sub-part F of F.C.C. part 68.500. The connector 10 is mechanically mounted to the printed circuit board 14 by means of posts 22 which are received in corresponding openings 23 in the printed circuit board.

As noted above, problems arise in the use of conventional modular jacks for high speed data transmission because of the necessary close spacing between the jack contacts and other electrical conductors of the connector. More particularly, modular jacks generally include a plurality of closely spaced, substantially parallel wire contacts adapted to be engaged by blade-like contacts of the modular plugs. The wire contacts are coupled to pin-like terminals of the jack, generally by length portions of common contact/terminal wires, which in turn are connected to the printed circuit. When a modular plug is inserted into the receptacle of a modular jack, the contact blades of the plug engage respective wire contacts of the jack. The signals flowing between the wire contacts and the pin-like terminals of each transmission circuit create electromagnetic and inductive fields which undesirably couple to other circuits resulting in near-end crosstalk.

In accordance with the illustrated embodiment of the invention, the jack contact/terminal wires of the respective pairs that terminate cable signal pairs 1 and 3 are asymmetrically constructed to thereby reduce capacitive and inductive coupling throughout the connector.

Referring to FIGS. 1*b* and 2–5, a jack 10 in accordance with a preferred embodiment of the invention comprises a dielectric housing 24 and a plurality of conductive contact/terminal wires 110*a* and 110*b*. Contact/terminal wires 110*a*, of which there are six, are configured to form a first set of rearward facing contacts 26*a* and associated pin-like terminals 25*a* while contact/terminal wires 110*b*, of which there are two, are configured to form a second set of forward facing contacts 26*b* and associated pin-like terminals 25*b*. In other words, the free ends 27*a* of contacts 26*a* are situated near, and face toward, the closed end of jack receptacle 20 while the free ends 27*b* of contacts 26*b* are situated near and face toward the entrance opening 21 of receptacle 20. The contacts 26*a* and 26*b* are substantially parallel and extend obliquely through jack receptacle 20 between upper positions proximate to the forward entrance opening 21 and lower positions at the rear of the receptacle. In the present context, it is understood that the term "substantially parallel" is broad enough to cover a construction in which the contacts 26*a* and 26*b* define a small angle at $\propto$ (FIG. 2) between them. The angle $\propto$ can vary between from 0° to about 10°. Jack 10 includes eight contacts 26 (six contacts 26*a* and two contacts **26*b***) and is constructed specifically for use with an eight contact modular plug terminating a four wire pair transmission cable with wire-contact assignments as specified by ANSI/EIA/TIA standard 568. However, it is understood that a connector in accordance with the principles of the invention may include more or less than eight contacts.

Figure 2:
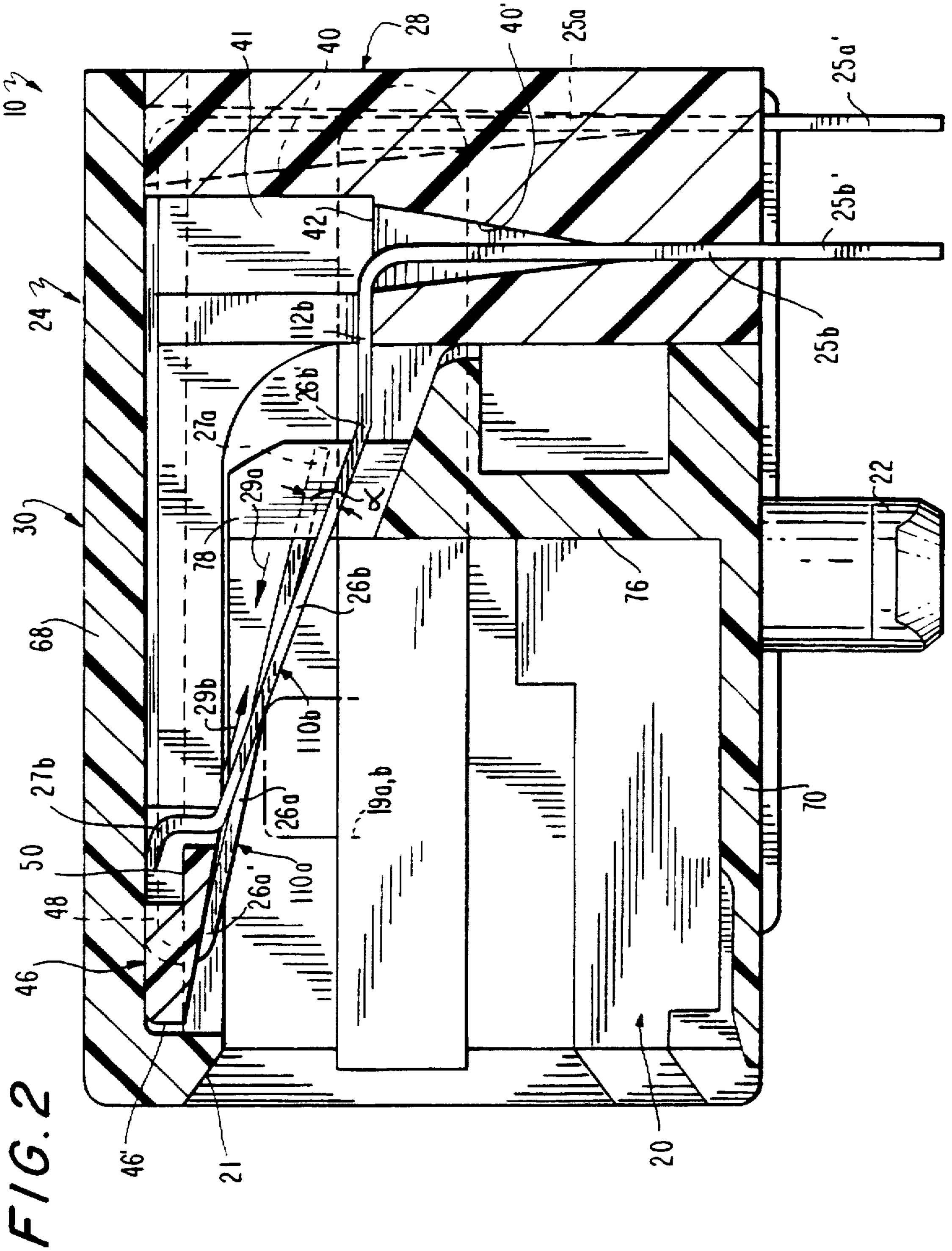
FIG. 2 is a longitudinal section view of the jack illustrated in FIG. 1*b* taken along line 2—2 of FIG. 1*b;*

The contact/terminal wires **110*a* and 110*b* are shaped and associated with jack housing 24 as described below so that when the contacts 26*a* and 26*b* are engaged by the contact blades 19 (FIG. 2) of the modular plug 18, the signals flow through the first rearward facing contacts 26*a* to their associated terminals 25*a* in a direction (designated by arrow 29*a* in FIG. 2) opposite to the direction in which the signals flow through the second forward facing contacts 26*b* toward their associated terminals 25*b* (designated by arrow 29*b*** in FIG. 2).

The rearward facing contacts **26*a* are positioned with respect to the forward facing contacts 26*b* in accordance with an arrangement which has been found to provide substantial isolation of near-end crosstalk when jack 10 is coupled to a modular plug whose contacts are assigned to terminate the cable wires according to ANSI/EIA/TIA standard 568. Twisted wire or cable signal pair "3" assigned to plug/jack contacts at positions "P3" and "P6" is typically used to transmit and receive information in such cable, and in accordance with the invention, the jack contact/terminal wires situated at positions "P3" and "P6" have asymmetrical forward and rearward facing configurations. Likewise, the jack contacts that are situated at positions "P4" and "P5" which are engaged by corresponding plug contacts that terminate the twisted wire pair designated "1" are asymmetrical, rearward and forward facing contacts 26*a* and 26*b*. In the illustrated embodiment, the jack contacts situated at positions "P1" and "P2" which are engaged by corresponding plug contacts that terminate twisted wire pair "2" are both rearward facing contacts 26*a*** as are the jack contacts situated at positions "P7" and "P8" that are engaged by corresponding plug contacts that terminate twisted wire pair "4". It has been found that with this particular positional arrangement of the eight forward facing (F) and rearward facing (R) jack contacts, i.e., RRFRFRRR, optimum isolation for source/victim twisted wire pairs "1" and "3" (which generally generate the greatest NEXT) is achieved when coupled to an eight position modular plug whose contacts are assigned to terminate 4 twisted wire pair cable according to ANSI EIA/TIA standard 568. This is accomplished without introducing additional NEXT failures associated with the jack contacts at positions "P4"–"P5" (wire pair "1") and the jack contacts at positions "P1"–"P2" (wire pair "2") or "P7"–"P8" (wire pair "4").

Figure 3:
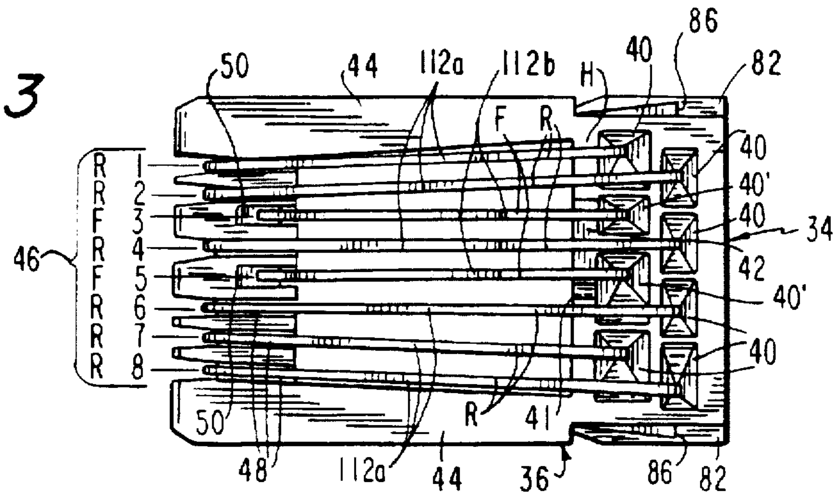
FIG. 3 is a top plan view of an assembly of the contact housing part and the contact/terminal wires of the jack illustrated in FIGS. 1 and 2.
Figure 4:
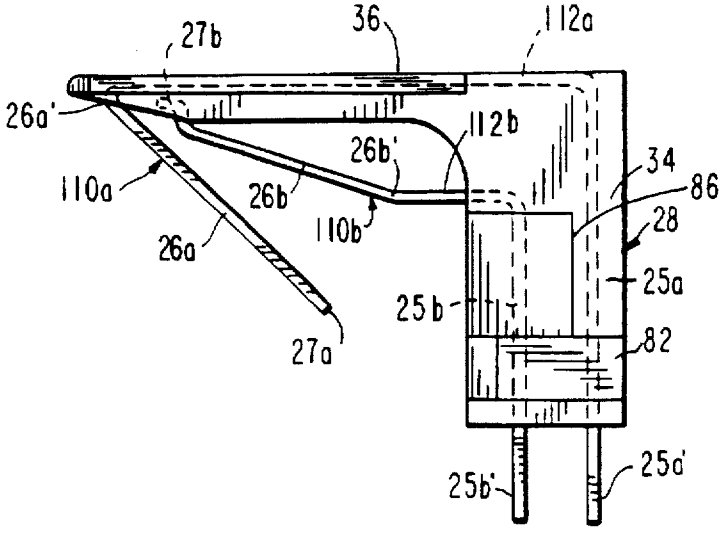
FIG. 4 is a side elevation view of the assembly illustrated in FIG. 3.
Figure 5:
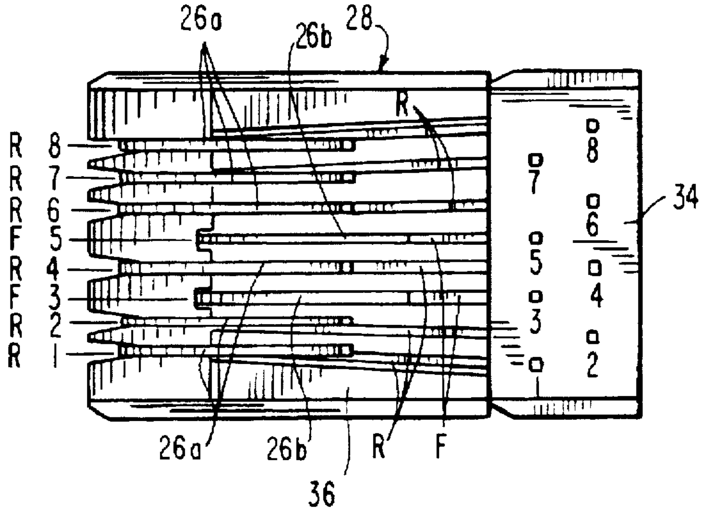
FIG. 5 is a bottom plan view of the assembly illustrated in FIGS. 3 and 4.

Jack housing 24 comprises a contact housing part 28 and an outer housing part 30 formed of suitable plastic material which together define the receptacle 20 for receiving a modular plug of the type designated 18 in FIG. 1*a*. Contact housing part 28 has a generally L-shaped configuration including a back portion 34 and a frame-shaped top portion 36 extending from the top of the back portion 34 in a cantilever fashion. A first set of four tapered parallel bores 40 extend through the rear part of the back portion 34, and a second set of four tapered parallel bores 40 extend through the front part of back portion 34. As seen in FIGS. 2 and 3, the central upper region of the front part of back portion 34 is notched out at 41 so that the two of the four bores 40, designated 40', that extend through the front part of back portion 34 at locations corresponding to contact positions 3 and 5, open onto an upwardly facing surface 42 situated at about the mid-height of back portion 34. Thus, six full height bores 40 open onto the top surface of back portion 34 while two bores 40' open onto the surface 42 situated at the mid-height of the back portion. As best seen in FIG. 3, the frame-shaped top portion 36 includes a pair of elongate side portions 44 projecting forwardly from the upper end of back portion 34 and a transversely extending front portion 46 extending transversely between side portions 44. Guide channels 48 are formed on the upper surface of front portion 46 at locations corresponding to contact positions P1, P2, P4 and P6–P8, i.e., at locations corresponding to the positions of rearward facing contacts **26*a* and curve around to the lower surface of the front portion 46 with the curved portion recessed behind the front surface 46' of front portion 46. As seen in FIGS. 2 and 3, the transverse front portion 46 has upwardly facing stop surfaces 50 formed at locations corresponding to contact positions P3 and P5, i.e., at locations corresponding to the positions of forward facing contacts 26*b***.

Each of the six "rearward" contact/terminal wires **110*a* is formed of an appropriate resilient conductive material, such as phosphor bronze, and is shaped to include a length portion defining a rearwardly facing contact 26*a*, a length portion defining an associated pin-like terminal 25*a* and a length portion defining a conductor 112*a* interconnecting the contact 26*a* from its front end 26*a*' to terminal 25*a*. The rearward contact/terminal wires 110*a* are assembled to contact housing part 28 as follows. Each pin-like terminal 25*a* is positioned in a respective one of the six full height bores 40 and has a length such that a bottom length portion 25*a*' projects out from the bottom of bore 40 for connection to the printed circuit. Each conductor 112*a* extends longitudinally from the upper end of a respective terminal 25*a* across the open space defined by frame-shaped top portion 36 and is received in a respective one of the guide channels 48 formed in front portion 46. Each contact 26*a* extends rearwardly in a downward direction from the curved front end of a respective conductor 112*a* situated in a guide channel 48 and terminates at the free end 27*a***.

Each of the two "forward" contacts/terminal wires **110*b* is also formed of resilient conductive material and is shaped to include a length portion defining forwardly facing contact 26*b*, a length portion defining an associated pin-like terminal 25*b* and a length portion defining a conductor 112*b* interconnecting the contact 26*b* from its rear end 26*b*' to terminal 25*b*. The forward contact/terminal wires 110*b* are assembled to contact housing part 28 as follows. Each pin-like terminal 25*b* is positioned in a respective one of the two shorter bores 40' and has a length such that a bottom length portion 25*b*' projects out from the bottom of bore 40' for connection to the printed circuit. Each conductor 112*b* extends longitudinally from the upper end of a respective terminal 25*b* for a relatively short distance. Each contact 26*b* extends forwardly in an upward direction from the front end of a respective conductor 112*b* and terminates at the free end 27*b* which is shaped to overlie a respective one of the stop surfaces 50 (FIG. 2) formed in front portion 46**.

The outer housing part 30 comprises a unitary member formed by opposed top and bottom walls 68 and 70 and opposed side walls 72 defining an interior space between them. Posts 22 project downwardly from the bottom wall 70 for connecting the jack to the printed circuit board. A pair of flanges 74 project laterally from side walls 72 for facilitating mounting of the jack to a chassis, if desired.

A wall 76 extends upwardly from bottom wall 70 and divides the interior of the outer housing part 30 into a forward space comprising receptacle 20 in which the modular plug is received and a rearward space for receiving the back portion 34 of contact housing part 28. A plurality of spaced partitions 78 are formed at the upper end of wall 76 that define eight guide slots 80 between them and which terminate at their upper ends at a distance spaced from the top wall 68 of outer housing part 30.

In assembly, the contact housing part 28 and associated contact/terminal wires **110*a* and 110*b* are inserted into the outer housing part 30 from its rear end. Rails 82 on the contact housing part are received in corresponding channels (not shown) formed in the outer housing part. During insertion, the six rearward facing contacts 26a are aligned with and received in the guide slots 80 corresponding to jack contact positions 1, 2, 4 and 6–8, while the two forward facing contacts 26b are aligned with and received in the guide slots 80 corresponding to jack contact positions 3 and 5. The partitions 78 serve to precisely position the rearward and forward facing contacts 26a and 26b and prevent them from contacting each other during operation. A locking shoulder 86 formed on each side of the back portion 34 of contact housing part 28 snaps into engagement with a corresponding shoulder (not shown) in the outer housing part 30** to lock the contact housing part and associated contacts to the outer housing part.

The charge stored between asymmetrically configured forward and rearward facing jack contact/terminal 26b and 26a at positions "P3" and "P6" that terminate signal pair 3 is substantially reduced as compared to the charge that would be stored in the case, for example, where two rearward facing contact/terminals were situated at those positions. Similarly, the axis of the loop current flowing through asymmetrical contact/terminal wire pairs is tilted or skewed thereby reducing magnetic field coupling between signal pairs relative to the case where the contact/terminal wires were identically configured. In this manner both capacitive and inductive coupling is reduced.

The arrangement of forward and rearward facing contacts described above, namely RRFRFRRR will essentially compensate for a split twisted pair where the normal pairing is split up and the individual wires are paired with wires from another pair. However, the invention is not limited to such an arrangement, and alternate wiring configurations will dictate rotating forward and rearward facing contacts for optimum cancellation or compensation effects. For example, other arrangements of forward and rearward facing contacts in a connector in accordance with the invention include RFRFRRRR and FRFRRRRR.

Obviously, numerous modifications and variations of the present invention are possible in light of the above teachings. The invention may be applied in connectors other than of a type adapted for use with cables whose wires are assigned to contacts in a manner other than as specified by EIA/TIA standard 568 of ANSI. For example, the arrangement of forward and rearward facing contacts may vary from that shown and described, e.g., and/or signals may flow from a forward facing contact in one direction to and through a rearward facing contact in another direction. Connectors in accordance with the invention may be other than of a type adapted for connection to printed circuit boards, and other configurations of conductors, terminals and contacts are possible in accordance with the invention. Accordingly, it is understood that other embodiments of the invention are possible in the light of the above teachings.

What is claimed is:

1. An electrical connector, comprising:

a housing having a receptacle face; and a plurality of contact/terminal wires in said housing having contact regions lying substantially along a single line parallel to the receptacle face, each of said plurality of contacts having an elongate contact and terminal, and said plurality of contact/terminal wires including at least one pair of asymmetrical contact/terminal wires having geometrical configurations which differ from each other, wherein a first one of said contact/terminal wires of said asymmetrical pair includes a forward facing contact, and a second one of said contact/terminal wires of said asymmetrical pair includes a rearward facing contact.

2. An electrical connector as recited in claim 1, wherein said forward and rearward facing contacts are substantially parallel to each other.

3. An electrical connector as recited in claim 1 wherein said forward facing contact of said first contact/terminal wire includes a forward free end and a rearward end electrically coupled to said terminal of said first contact/terminal wire, and said rearward facing contact of said second contact/terminal wire includes a rearward free end and a forward end electrically coupled to said terminal of said second contact/terminal wire.

4. An electrical connector as recited in claim 3 wherein said first contact/terminal wire includes a conductor wire portion electrically coupling said rearward end of said forward facing contact to said terminal of said first contact/terminal wire; and said second contact/terminal wire includes a conductor wire electrically coupling said forward end of said rearward facing contact to said terminal of said second contact/terminal wire.

5. An electrical connector, comprising:

a housing having a receptacle face; and a plurality of contact/terminal wires in said housing having contact regions lying substantially along a single line parallel to the receptacle face, each of said plurality of contacts having an elongate contact and terminal, and said plurality of contact/terminal wires including at least one pair of asymmetrical contact/terminal wires having geometrical configurations which differ from each other, wherein said electrical connector comprises at least eight of said contact/terminal wires including at least two pairs of asymmetrical contact/terminal wires, wherein at least six of said contact/terminal wires comprise forward facing contacts and at least two of said contact/terminal wires comprise rearward facing contacts.

6. An electrical connector comprising:

a housing;

a first contact wire and a second contact wire substantially parallel to the first contact wire forming a first contact wire pair in the housing, the first contact wire having a first contacting portion and the second contact wire having a second contacting portion; and a third contact wire and a fourth contact wire substantially parallel to the third contact wire forming a second contact wire pair situated inside and substantially parallel to the first contact wire pair, the third contact wire having a third contacting portion and the fourth contact wire having a fourth contacting portion and wherein the third contact wire is adjacent to the first contact wire, the fourth contact wire is adjacent to the third contact wire and the second contact wire is adjacent to the fourth contact wire, the first, second, third, and fourth contacting portions being substantially coplanar, and the first contact wire having a shape which is different than the second contact wire, the third contact wire having a shape which is different than the fourth contact wire, the first contact wire having a shape which is different than the third contact wire, and the fourth contact wire having a shape which is different than the second contact wire.

* * * * *